(12) United States Patent
Combs et al.

(10) Patent No.: US 6,285,075 B1
(45) Date of Patent: Sep. 4, 2001

(54) INTEGRATED CIRCUIT PACKAGE WITH BONDING PLANES ON A CERAMIC RING USING AN ADHESIVE ASSEMBLY

(75) Inventors: Edward G. Combs, Foster City; Robert Sheppard, Redbluff, both of CA (US)

(73) Assignee: ASAT, Limited, Tsuen Wan NT (HK)

( * ) Notice: Subject to any disclaimer, the term of this patent is extended or adjusted under 35 U.S.C. 154(b) by 0 days.

(21) Appl. No.: 09/184,787

(22) Filed: Nov. 2, 1998

(51) Int. Cl.[7] .................................................. H01L 23/48
(52) U.S. Cl. ........................ 257/675; 257/691; 257/706; 257/796
(58) Field of Search .................................. 257/675, 706, 257/796, 691

(56) References Cited

U.S. PATENT DOCUMENTS

| | | | |
|---|---|---|---|
| 4,862,245 | * 8/1989 | Pashby et al. ........................ | 357/70 |
| 4,975,761 | * 12/1990 | Chu ....................................... | 257/686 |
| 5,172,213 | * 12/1992 | Zimmerman ........................... | 257/796 |
| 5,367,196 | * 11/1994 | Mahulikar et al. .................... | 257/787 |
| 5,504,372 | * 4/1996 | Braden et al. ......................... | 257/723 |
| 5,757,070 | * 5/1998 | Fritz ...................................... | 257/675 |
| 5,895,966 | * 4/1999 | Penchuk ................................ | 257/690 |

FOREIGN PATENT DOCUMENTS 4-137756  *  5/1992  (JP) ..................................... 257/706

\* cited by examiner

*Primary Examiner*—Roy Potter
(74) *Attorney, Agent, or Firm*—Gallagher & Lathrop; Thomas A. Gallagher

(57) ABSTRACT

An integrated circuit package includes a ceramic ring having an inside cavity for accommodating a semiconductor die. Conductive traces are provided on the ceramic ring so as to serve as power and ground signal busses. Power and ground connection pads on the semiconductor die can be commonly bonded to these conductive traces, which are in turn commonly bonded to selected pins of the lead frame. In addition, an acrylic adhesive is used as a moisture-resistant adhesive.

19 Claims, 4 Drawing Sheets

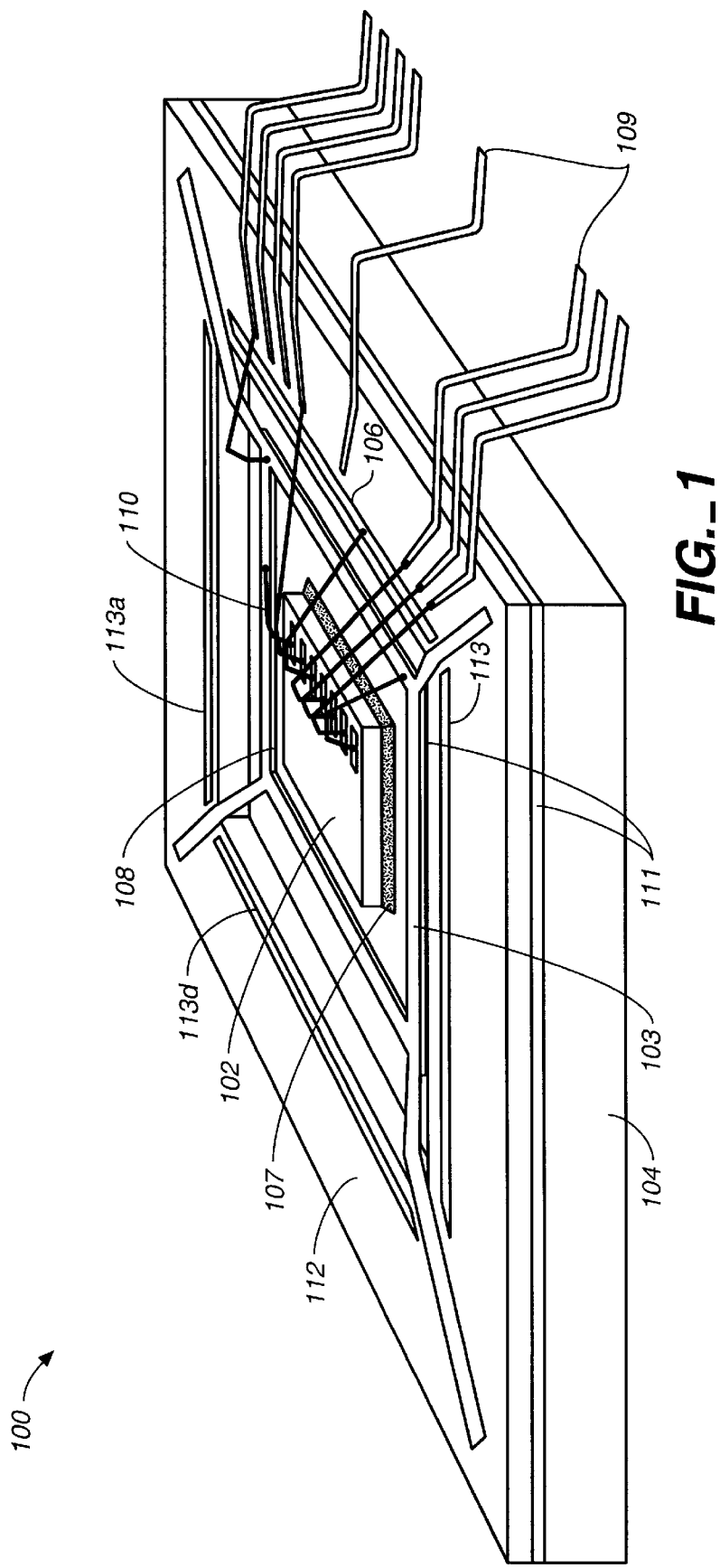
FIG._1

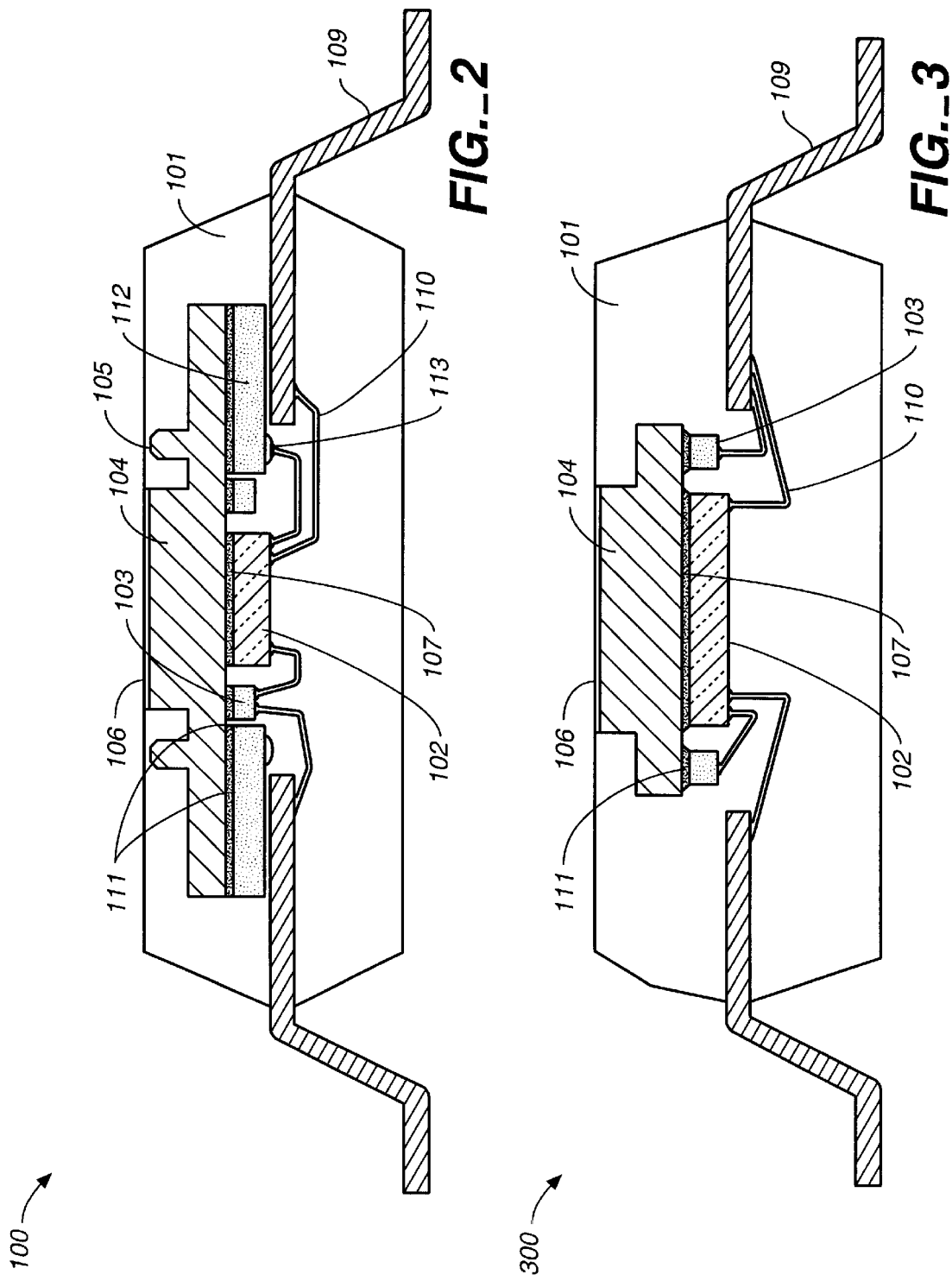

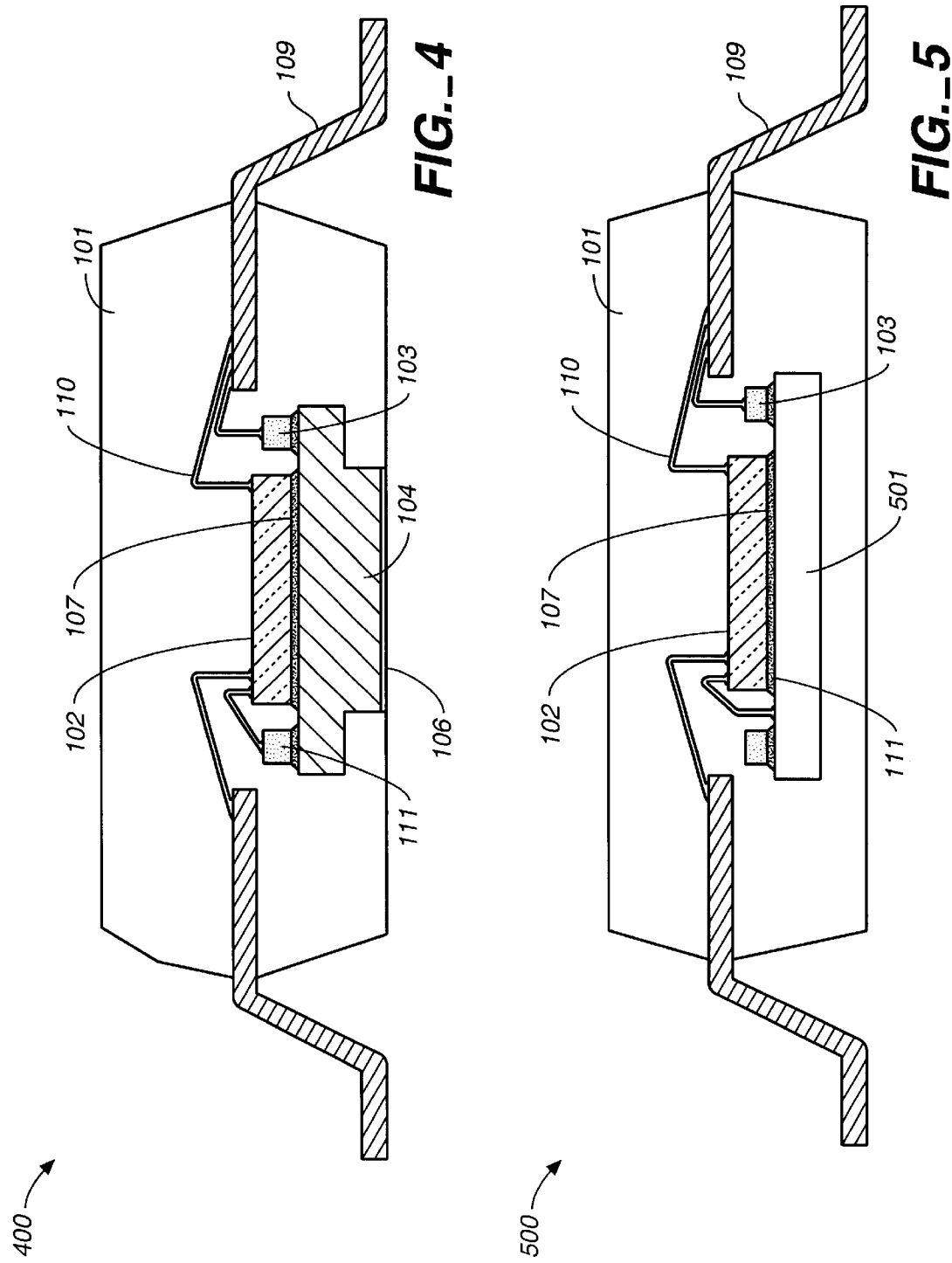

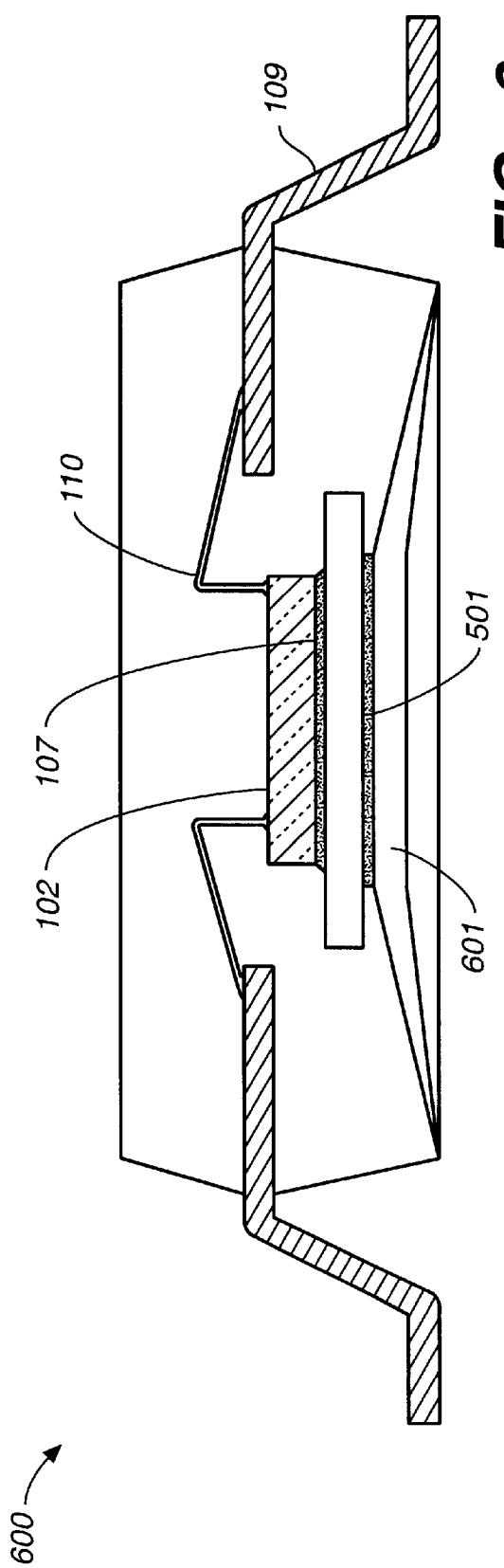

INTEGRATED CIRCUIT PACKAGE WITH BONDING PLANES ON A CERAMIC RING USING AN ADHESIVE ASSEMBLY

CROSS REFERENCE TO RELATED APPLICATIONS

The present invention is related to a copending patent application ("Copending Application") entitled "Molded Plastic Package with Heat Sink and Enhanced Electrical Performance," by M. Karnezos, Edward G. Combs et al., Ser. No. 08/116,305, filed on Sep. 3, 1993, and assigned to ASAT, Limited, which is also the assignee of the present application. The disclosure of the Copending Application is hereby incorporated by reference in its entirety.

BACKGROUND OF THE INVENTION

1. Field of the Invention

The present invention relates to integrated circuit packages. In particular, the present invention relates to integrated circuit packages with high electrical and thermal performances.

2. Discussion of the Related Art

In a plastic package, such as that described in the Copending Application, a heat sink or heat spreader coated with a layer of aluminum oxide for electrical isolation can be provided for heat dissipation. However, while such a package provides good thermal performance, imperfection in the aluminum oxide layer leads to high yield loss.

Further, in integrated circuit packages, the semiconductor die is typically attached to a die-attach pad, which may be formed integrally with the lead frame. The semiconductor die can be attached using an adhesive based on a B-stage polyimide resin. However, polyimide resins have weak bonding strength to metals and absorbs moisture. In addition, such an adhesive requires a curing step at an elevated temperature over an extended period of time.

SUMMARY OF THE INVENTION

According to one aspect of the present invention, an integrated circuit package is provided which includes: (a) a heat spreader; (b) a semiconductor die attached to the heat spreader by an adhesive; (c) leads each including an internal portion for bonding and an external portion to serve as an external terminal for the integrated circuit package; (d) bond wires each bonding one of the internal portions of the leads to a bonding pad of the semiconductor die; and (e) a resin encapsulation enclosing the heat spreader, the semiconductor die, the internal portions of the leads and the bond wires.

In one embodiment, a ceramic ring with conductive traces for bonding provided thereon is attached to the heat spreader using an adhesive. In that embodiment, a first bond wire electrically couples one of the conductive traces of the ceramic ring to the internal portion of one of the leads; and a second bond wire electrically coupling that conductive trace of the ceramic ring to one of the bonding pads. The adhesive attaching the ceramic ring to the heat spreader can include an acrylic adhesive. Such an acrylic adhesive can be impregnated with a thermally conductive material. In one embodiment, the acrylic adhesive is provided between the ceramic ring and the heat spreader in two layers, one of the layers being impregnated with a thermally conductive material. Each conductive trace can serve as either a ground or a power terminal. In one embodiment the conductive traces comprise gold. The ceramic can be provided with perforations into which the resin encapsulation material can flow during molding. The cured encapsulation material can then provide locking structures for properly securing the ceramic ring.

In accordance with another aspect of the present invention, a downset interposer ring can be attached to the heat spreader. The downset interposer ring can provide a segment positioned between the internal portion of one of the leads and the semiconductor die. Each segment can function as a power supply or ground signal terminal.

In accordance with another aspect of the present invention, an integrated circuit package includes (a) a die-attached pad; (b) a semiconductor die attached to the die-attach pad by an adhesive; (b) leads each including an internal portion for bonding and an external portion to serve as an external terminal for said integrated circuit package; (c) a downset interposer ring attached to the die-attach pad, the downset interposer ring having a segment positioned between the internal portion of one of the leads and the semiconductor die; (d) bond wires each electrically coupling one of the internal portions of the leads to one of the bonding pads of the semiconductor die, and a bond wire electrically coupling the segment of the downset interposer ring to a bonding pad of the semiconductor die; and (e) a resin encapsulation enclosing the die-attach pad, the semiconductor die, the internal portions of the leads and the bond wires. In one embodiment, a heat spreader is attached by adhesive to the die-attach pad.

The present invention is better understood upon consideration of the detailed description below and the accompanying drawings.

BRIEF DESCRIPTION OF THE DRAWINGS

FIG. 1 is a cross sectional view of an integrated circuit package 100 in accordance with the present invention.

FIG. 2 shows integrated circuit package 100 of FIG. 1, as viewed from an oblique angle, without its resin encapsulation 101.

FIG. 3 shows another embodiment of the present invention in integrated circuit package 300, provided in the "die-down" configuration.

FIG. 4 shows another embodiment of the present invention in integrated circuit package 400, provided in the "die-up" configuration.

FIG. 5 shows integrated circuit package 500, which is an alternative embodiment of the present invention in which semiconductor die 102 is attached to a die-attach pad 501, rather than heat sink 104.

FIG. 6 shows integrated circuit package 600, similar to integrated circuit package 500, but including heat spreader 601.

DETAILED DESCRIPTION OF THE PREFERRED EMBODIMENTS

Integrated circuit package 100, shown in cross section and oblique elevation in FIGS. 1 and 2, respectively, is an embodiment of the present invention. In this detailed description, like elements in the various figures are designated like reference numerals.

As shown in FIGS. 1 and 2, integrated circuit package 100 encloses a semiconductor die 102 in a molded resin encapsulation 101. Semiconductor die 102 is attached by a die-attach adhesive 107 (e.g., an epoxy resin) to heat sink 104, which is typically a oxygen-free high conductivity (OFHC)

copper heat sink. (Although FIGS. 1 and 2 show a "die-up" configuration, the present invention can be practiced in a "die-down" configuration also). Heat sink 104 includes mold-locking cones 105, which provide additional grip onto molded resin encapsulation 101. The portion of heat sink 104 exposed to the outside of resin encapsulation 101 is plated with a film 106 of nickel or solder. Integrated circuit package 100 further includes formed leads 109 and downset interposer ring 103 which are electrically coupled to various signal lines on semiconductor die 102 through bond wires 110 and bonding pads (not shown) on the semiconductor die. Downset interposer ring 103 and leads 109 can be integrally formed from the same lead frame and separated chemically or mechanically, or both, as is known in the art. Downset interposer ring 103 can provide a ground or power ring to which the ground or power pads of semiconductor die 102 and ground or power pins of integrated circuit package 100 (i.e., ground or power pins in formed leads 109) can be electrically coupled using wire bonds.

In this embodiment, an annular ceramic ring 112 is provided between heat sink 104 and formed leads 109. According to the present invention, conductive traces ("bonding planes") 113a–113d FIG. can be provided on the surface of ceramic ring 112. Bonding planes 113a–113d can be provided as "thick films" (e.g., 100 microns thick) by a silk screening process, or as a "thin films" (e.g., a few microns thick) by an evaporative process, such as sputtering. Each of bonding planes 113a–113d FIG. is provided on ceramic ring 112 as a conductive segment. However, other patterns of segmentation, including no segmentation (i.e., complete rings) can be provided. Common ground or power planes are achieved by wire-bonding ground or power pads of semiconductor die 102 and ground or power pins of formed leads 109 to bonding planes 113a–113d.

Ceramic ring 112 can be provided by a ceramic which includes alumina, tungsten, mica, diamond, beryllia, or other materials to achieve various thermal and electrical performance. In this embodiment, ceramic ring 112 can be provided a thickness of up to 25 mils thick, preferably approximately 10 mils thick for desirable thermal and electrical performance. Perforations can be provided at predetermined positions of the ceramic ring, so as to allow flow of resin encapsulation material into the perforations during molding, thereby securely positioning the ceramic ring within the package.

In this embodiment, downset interposer ring 103 and ceramic ring 112 are each attached to heat sink 104 via an acrylic adhesive layer 111. Unlike a polyimide-based adhesive, an acrylic adhesive does not absorb moisture and thus avoids failure mode relating to moisture and corrosion. Also, unlike a polyimide-based adhesive, which is typically cured at an elevated temperature, an acrylic adhesive can be applied and set using a "cold assembly" technique (i.e., at room temperature) over a time period shorter than is required for curing a polyimide-based adhesive. Application of the acrylic adhesive is preferably performed in a clean room. Further, to provide good heat transfer performance, an acrylic adhesive can be impregnated with aluminum oxide or alumina particles. The amount of aluminum oxide can be adjusted to provide a thermal coefficient of expansion (TCE) that matches the TCE of ceramic ring 112 to avoid cracking due to the mismatch in TCEs. The acrylic adhesive can be made conductive by including conductive metal filings. When downset interposer ring 103 is provided as a ground plane, a conductive acrylic adhesive can be used to ground downset interposer ring 103 to heat sink 104. Conversely, for good electrically insulation, two layers of acrylic adhesives can be provided in an acrylic adhesive layer: a pure acrylic layer and aluminum oxide-impregnated acrylic adhesive to provide good thermal conduction and good electrical isolation performance.

Alternatively, the present invention can be practiced without ceramic ring 112 in small outline integrated circuit (SOIC) packages. FIGS. 3 and 4 show integrated circuit packages 300 and 400, which are embodiments of the present invention, provided in the "die-down" and "die-up" configurations, respectively, without ceramic ring 112.

FIG. 5 shows integrated circuit package 500, which is an alternative embodiment of the present invention in which semiconductor die 102 is attached to a die-attach pad 501, rather than heat sink 104. Die-attach pad 501 can also be formed integrally in a lead frame with leads 109 and separated by a chemical or mechanical process, or both, as is known in the art. Downset interposer ring 103 can be electrically isolated from die-attach pad 501 using a non-conductive acrylic adhesive. In addition, a commercially available heat spreader (e.g., a suitably formed metal plate with a relatively large surface area) can be provided in a package similar to integrated circuit package 500 to increase thermal performance of the package. For example, FIG. 6 shows such an integrated circuit package 600 including a commercially available heat spreader 601. Heat spreader 601 can be attached to die-attach pad 501 using an acrylic adhesive with a suitable thermal conductivity, in accordance with the present invention.

The above detailed description is provided to illustrate the specific embodiments of the present invention and should not be read as limiting the present invention. Numerous variations and modifications within the scope of the present invention are possible. The present invention is defined by the following claims.

What is claimed is:

1. A integrated circuit package, comprising:
   a heat spreader;
   a semiconductor die having a plurality of connection pads, said semiconductor die attached to said heat spreader by an adhesive;
   a plurality of leads each including an internal portion for bonding and an external portion to serve as an external terminal for said integrated circuit package;
   a plurality of bond wires each bonding one of said internal portions of said plurality of leads to one of said connection pads, for electrically connecting said connection pads of said semiconductor die to said plurality of leads;
   a ceramic ring enclosing said semiconductor die and attached to said heat spreader using an acrylic adhesive, said ceramic ring having provided thereon conductive traces for bonding, wherein a first one of said bond wires electrically couples one of said conductive traces of said ceramic ring to said internal portion of one said plurality of leads, and a second one of said bond wires electrically couples said one of said conductive traces of said ceramic rind to one of said connection pads; and
   a resin encapsulation enclosing said heat spreader, said semiconductor die, said internal portions of said plurality of leads and said plurality of bond wires.

2. An integrated circuit package as in claim 1, wherein said acrylic adhesive is impregnated with a thermally conductive material.

3. An integrated circuit package as in claim 1, wherein said acrylic adhesive is provided between said ceramic ring and said heat spreader in two layers, one of said layer being impregnated with a thermally conductive material.

4. An integrated circuit package as in claim 1, wherein said one of said conductive traces is electrically coupled to receive a ground potential.

5. An integrated circuit package as in claim 1, wherein said one of said conductive traces is electrically coupled to receive a power supply signal.

6. An integrated circuit as in claim 1, further comprising:
   a heat spreader;
   a semiconductor die having a plurality of connection pads, said semiconductor die attached to said heat spreader by an adhesive;
   a plurality of leads each including an internal portion for bonding and an external portion to serve as an external terminal for said integrated circuit package;
   a plurality of bond wires each bonding one of said internal portions of said plurality of leads to one of said connection pads, for electrically connecting said connection pads of said semiconductor die to said plurality of leads;
   a downset interposer ring attached by an acrylic adhesive to said heat spreader, said downset interposer having a segment positioned between said internal portion of one of said plurality of leads and said semiconductor die, wherein a first bond wire electrically couples said segment of said interposer ring to said internal portion of said plurality of leads and a second bond wire electrically couples said segment of said interposer ring to one of said connection pads; and
   a resin encapsulation enclosing said heat spreader, said semiconductor die, said internal portions of said plurality of leads and said plurality of bond wires.

7. An integrated circuit package as in claim 6, wherein said acrylic adhesive is impregnated with a thermally conductive material.

8. An integrated circuit package as in claim 6, wherein said acrylic adhesive is provided between said downset interposer ring and said heat spreader in two layers, one of said layers being impregnated with a thermally conductive material.

9. An integrated circuit package as in claim 6, wherein said segment of said downset interposer ring is electrically coupled to receive a ground potential.

10. An integrated circuit package as in claim 6, wherein said one of said segment of said downset interposer ring is electrically coupled to receive a power supply signal.

11. An integrated circuit package as in claim 6, wherein said heat spreader includes a portion exposed outside of said plastic encapsulation, said portion being plated with a metal film.

12. An integrated circuit package as in claim 1, wherein said conductive traces comprise gold.

13. An integrated circuit package as in claim 1, wherein said ceramic ring has perforation at predetermined positions of said ceramic ring.

14. An integrated circuit package as in claim 1, wherein said integrated circuit package is configured in a die-up configuration.

15. An integrated circuit package as in claim 1, wherein said integrated circuit package is configured in a die-down configuration.

16. An integrated circuit package, comprising:
   a die-attach pad;
   a semiconductor die having a plurality of connection pads, said semiconductor die attached to said die-attach pad by an adhesive;
   a plurality of leads each including an internal portion for bonding and an external portion to serve as an external terminal for said integrated circuit package;
   a downset interposer ring attached by an acrylic adhesive to said die-attach pad, said downset interposer having a segment positioned between said internal portion of one of said plurality of leads and said semiconductor die;
   a plurality of bond wires each electrically coupling one of said internal portions of said plurality of leads to one of said connection pads, wherein a first one of said bond wires electrically coupling said segment of said interposer ring to said internal portion of said plurality of leads and wherein a second bond wire electrically coupling said segment of said interposer ring to one of said connection pads; and
   a resin encapsulation enclosing said die-attach pad, said semiconductor die, said internal portions of said plurality of leads and said plurality of bond wires.

17. An integrated circuit as in claim 16, further comprising a heat spreader attached by adhesive to said die-attach pad.

18. An integrated circuit package as in claim 16, wherein said acrylic adhesive is impregnated with a thermally conductive material.

19. An integrated circuit package as in claim 16, wherein said acrylic adhesive is provided between said downset interposer ring and said die-attach pad in two layers, one of said layer being impregnated with a thermally conductive material.

* * * * *